(12) United States Patent
Matsuse et al.

(10) Patent No.: US 6,454,909 B1
(45) Date of Patent: Sep. 24, 2002

(54) METHOD AND APPARATUS FOR FORMING A FILM ON AN OBJECT TO BE PROCESSED

(75) Inventors: Kimihiro Matsuse, Inagi; Sakae Nakatsuka, Kitakoma-gun; Kentaro Oshimo, Nakakoma-gun, all of (JP)

(73) Assignee: Tokyo Electron Limited, Tokyo (JP)

( * ) Notice: Subject to any disclaimer, the term of this patent is extended or adjusted under 35 U.S.C. 154(b) by 0 days.

(21) Appl. No.: 09/611,665

(22) Filed: Jul. 6, 2000

(30) Foreign Application Priority Data

Jul. 7, 1999 (JP) .......................................... 11-193777

(51) Int. Cl.$^7$ ........................... C23C 14/34; C23C 8/00; B44C 1/22; B05C 13/00; C23E 1/02
(52) U.S. Cl. ............................. 204/192.12; 204/298.15; 204/298.25; 216/37; 216/41; 427/585; 427/331; 118/500; 156/345
(58) Field of Search ..................... 204/192.12, 298.25, 204/298.07, 298.15; 216/37, 41; 427/585, 331; 118/500; 156/345

(56) References Cited

U.S. PATENT DOCUMENTS 4,951,601 A * 8/1990 Maydan et al. ............. 118/719

5,354,715 A * 10/1994 Wang et al. ................ 437/238
5,371,410 A * 12/1994 Chen et al. ................. 257/750
5,635,244 A * 6/1997 Mayeda et al. ........... 427/248.1

* cited by examiner

Primary Examiner—Steven H. VerSteeg
(74) Attorney, Agent, or Firm—Oblon, Spivak, McClelland, Maier & Neustadt, P.C.

(57) ABSTRACT

A processing apparatus includes a processing chamber, a support mechanism provided in the processing chamber to support a wafer having an underlying film formed on a major surface and adjacent side face, and a supply member provided at the processing chamber and spaced from the support mechanism, to supply an incoming gas into the processing chamber. A gas carrying mechanism is provided for selectively sending a film forming gas and etching gas to the gas supply member. A main film is formed on a portion of an underlying film formed on the wafer supported on the support mechanism, by using the film forming gas supplied from the gas supply member. A portion of the underlying film, which is exposed, not covered with the main film, is etched away by the etching gas supplied from the gas supplied member.

18 Claims, 6 Drawing Sheets

METHOD AND APPARATUS FOR FORMING A FILM ON AN OBJECT TO BE PROCESSED

CROSS-REFERENCE TO RELATED APPLICATIONS

This application is based upon and claims the benefit of priority from the prior Japanese Patent Application No. 11-193777, filed Jul. 7, 1999, the entire contents of which are incorporated herein by reference.

BACKGROUND OF THE INVENTION

The present invention relates to a method and apparatus for forming a film on an object to be processed, such as a semiconductor wafer.

In general, in the manufacturing process of a semiconductor device, such as a semiconductor IC circuit, in order to form an interconnect pattern on one surface (major surface) of a semiconductor wafer constituting a to-be-processed object or bury a conductive material in a hole in an insulating film between interconnect lines, or achieve both, a metal or metallic compound, such as Al (aluminum), W (tungsten), WSi (tungsten silicide), Ti (titanium), TiN (titanium nitride) and TiSi (titanium silicide) is deposited to form a thin film.

Though, conventionally, aluminum has been mainly used as such a thin film material due to its easier manufacturing process, there is a recent tendency that, in place of aluminum, tungsten has been mainly used so as to achieve further microminiaturization and higher multi-layered structure or meet a high speed operation requirement. In order to improve an intimate contact with an underlying layer in the case of forming a tungsten film or to suppress the drawing up of Si atoms in the case where the Si atoms are included in the underlying layer, a TiN film for example is formed as a barrier metal film on the underlying surface and, by doing so, the tungsten film is deposited.

With reference to FIGS. 6A and 6B, an explanation will be made below about the film formation step at that time. In these Figures, the reference letter W shows a semiconductor wafer comprised of, for example, an Si substrate. The term "semiconductor wafer" used in the present invention is referred to as a semiconductor wafer alone or a semiconductor wafer with one or more required films formed on its surface. As shown in FIG. 6A, prior to forming a tungsten film on a major surface of a wafer W, a barrier film 2 comprised of a TiN film is deposited as an underlying film on the wafer. Then, a tungsten film 4 of a given thickness is deposited on the barrier metal film 2 as shown in FIG. 6B. In general, the barrier metal film 2 may be formed under a low pressure of a few Torrs with the use of a sputtering film forming method or thermal CVD (Chemical Vapor Deposition) method and, in order to enhance the manufacturing efficiency, the wafer is placed simply on a susceptor within a film forming apparatus and film forming processing is carried out without the wafer being fixed to the susceptor by a clamping ring, etc. Therefore, the barrier metal film 2 is formed not only on an intended one surface or major surface of the wafer W but also, as shown by the reference numeral 2A, on a not-intended curved side face W2 of the wafer, or, as the case may be, on the reverse surface portion W3 of the wafer. Since, on the other hand, the formation of the tungsten film 4 has to be made at a fairly higher pressure of 80 Torrs than the above mentioned pressure, there is a risk that, unlike the film formation of the barrier metal film 2, the wafer W will be displaced on the susceptor during the film formation. Therefore, the film formation processing is done by abutting a link-like clamping ring 6 against a whole peripheral edge area of the upper surface of the wafer W. In this case, the flowing of a film forming gas around the side face W2 and reverse surface portion W3 of the wafer W is suppressed by the abutting clamping ring 6. Thus, the tungsten film 4 is deposited on the major surface W1 only of the wafer W, that is, on the barrier metal film at an area surrounded with the clamping ring, and not deposited on the side face W2 and reverse surface portion W3. That is, the tungsten film is deposited on the barrier metal film portion on the intended major surface of the wafer.

As set out above, the barrier metal film portion 2A deposited on the side face W2 and reverse surface portion W3 is peeled off or separated from the wafer at a later process step or steps, thus presenting a "particle generation" problem.

BRIEF SUMMARY OF THE INVENTION

It is accordingly the object of the present invention is to provide a method and apparatus for forming a film on a to-be-processed object which can effectively eliminate any unwanted underlying film deposited on a side face and adjacent reverse surface portion of the object.

In one aspect of the present invention there is provided a method for forming a film, comprising: forming an underlying film on a major surface of a to-be-processed object and on a side face and adjacent reverse surface of the object, at least that side face; forming a main film on that portion of the underlying film portion corresponding to the major surface of the object; and etching the underlying film portion while leaving a given underlying film portion beneath the main film with the use of the main film as a mask.

By performing etching with a main film, that is, a main film formed on an underlying film, used as a mask it is possible to etch away an unwanted underlying film deposited on a side face and, if any, an adjacent reverse surface portion.

In this case, it is unavoidable that the main film serving as the mask has its upper surface portion slightly etched away and, as recited in claim 2, at the main film step for example, the main film is formed to a thickness greater than a target value by an extent corresponding to the etched-away amount of the main film at a later side-face etching step.

Even in this case, it is possible to etch away an unwanted underlying film deposited on a side face (and adjacent reverse-surface portion) of the object.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

With reference to the accompanying drawings, the embodiments of the present invention will be described below in convention with their method and apparatus for forming a film on an object to be processed.

Figure 1:
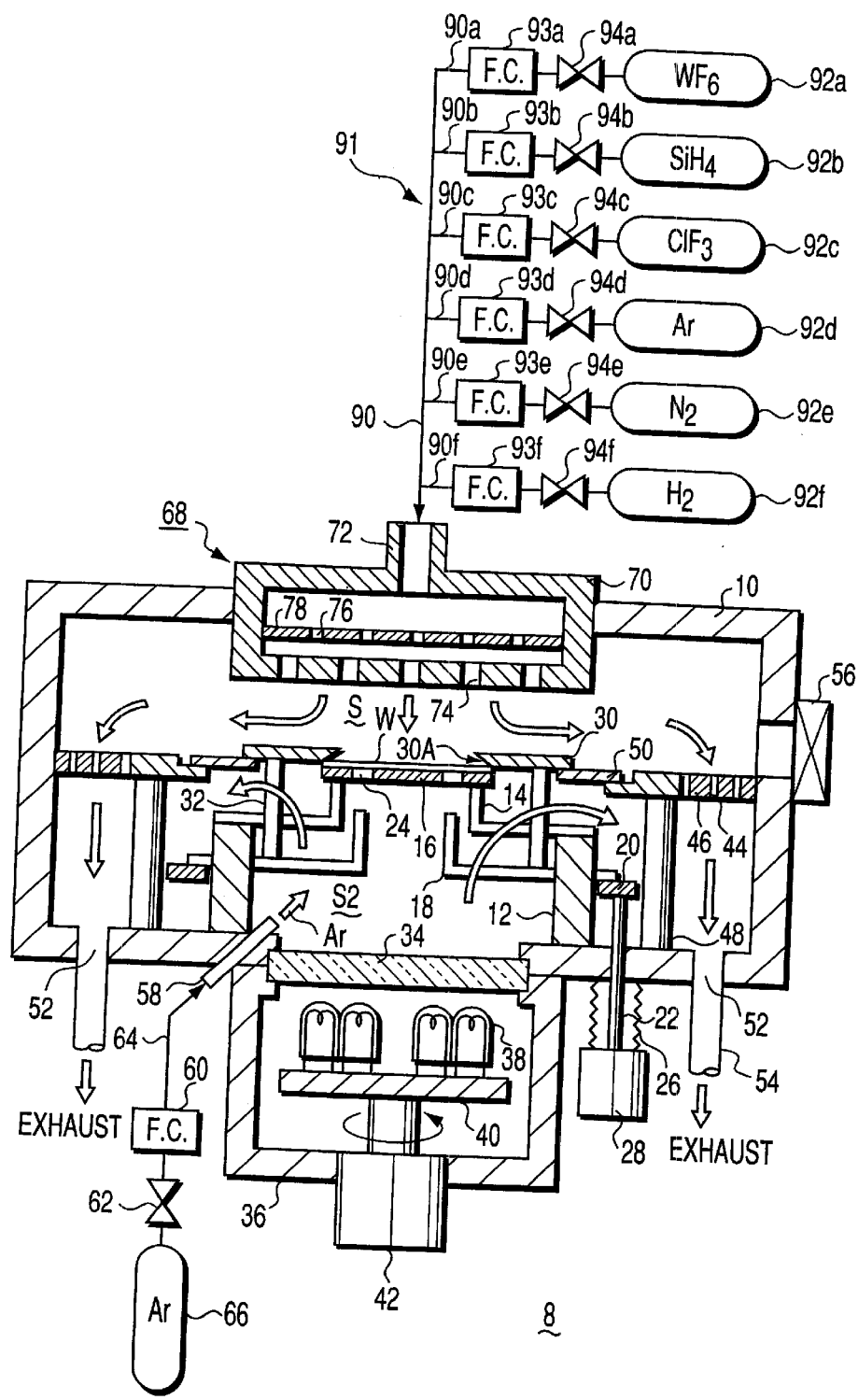
FIG. 1 is a view diagrammatically showing a processing apparatus for performing a process of a method according to the present invention.

FIG. 1 shows a processing apparatus 8 for the process of forming a tungsten film as a main film and process of etching an underlying film. The processing apparatus 8 has a processing chamber 10 formed as a cylindrical or rectangular box-like configuration with the use of a metal material, such as aluminum. Within the processing chamber 10, a susceptor 16 on which a semiconductor wafer W, that is, a to-be-processed object, is placed is mounted through a plurality of, for example, three, L-shaped retaining rods 14 (only two are shown in Figures) provided in an equidistant relation on a cylindrical reflector 12 standing from the bottom wall of the processing chamber. The reflector 12 is formed of a metal, such as aluminum, and the retaining rod 14 is formed of heat transmissive material, such as quartz. The susceptor 16 is formed of a carbon material of, for example, 1 mm thickness, aluminum compound such as AlN of, for example, about 2–3 mm thickness, etc.

Below the susceptor 16, a plurality of, for example, three, L-shaped lifter pins 18 (only two are shown in Figures) are provided in an equidistant relation with their base end portions fixed to a ring-like support member 20. The support member 20 is fixed to the upper end of push-up rod 22 provided in a way to extend through the bottom wall of the processing chamber. By moving the push-up rod up and down, the vertical arm section of the lifter pin 18 extends through a corresponding lifter pin hole 24 formed in the susceptor 16 to allow a wafer W to be lifted.

The lower end of the push up rod 22 is connected to an actuator 28 serving as a drive mechanism. Between the actuator 28 and the bottom wall of the processing chamber, the expandable/compressible bellows 26 are provided around the push-up rod to maintain the inside of the processing chamber 10 in a hermetically sealed state.

A clamping ring 30 is provided around the circumferential edge portion of the susceptor 16 to press a wafer onto the susceptor 16 over a whole circumference to the peripheral edge portion of the wafer W. The clamping ring 30 is made of a substantially ring-like ceramic material and has a similar contour configuration as to the wafer. An inner circumferential face of the clamping ring 30 provided as a face 30A contacting with the wafer is so formed as to provide a tapered face. The clamping ring 30 is connected to the lifter pins 18 through a plurality of, for example, three, support members 32 made of, for example, quartz and can be lifted as one unit integral with the lifter pin 18.

A transmission window 34 made of heat transmissive material, such as a quartz, is hermetically provided in the opening of the bottom wall of the processing chamber beneath the susceptor 16. Below the transmission window 34 a box-like heating chamber 36 is provided so as to surround the window therewith. Within the heating chamber 36 a plurality of heating lamps 38 are mounted as a heating means on a rotation base 40 serving as a reflection mirror. The rotation base 40 is rotated by a rotation motor 42 mounted on the bottom wall of the heating chamber 36 through a rotation shaft. Heat rays emitted from the heating lamps 38 passes through the transmission window 34 and is radiated onto the lower surface of the susceptor 16 to allow the susceptor to be heated. The heating means is not restricted to the heating lamp 38 and may be comprised of a resistance-heat type heater buried in, for example, the susceptor 16.

A ring-like flow regulating plate 46 having a larger number of current holes 44 is provided around the outer circumferential area of the susceptor 16 in such a way as to be horizontally supported by a plurality of support columns 48. On the inner circumferential side of the flow regulating plate 46, a ring-like attachment 50 made of quartz is provided in contact with the outer circumferential portion of the clamp ring 30 to prevent a processing gas from flowing downward. At the bottom wall beneath the plate 46, vent holes 52 are provided such that vent passages 54 connected to a vacuum pump, not shown, are connected to the vent holes 52. It is, therefore, possible to maintain a predetermined vacuum level within the processing chamber 10. At the sidewall of the processing chamber 10 a gate valve 56 is provided to allow the wafer to be loaded into and unloaded from the processing chamber 10.

Below the susceptor 16 a gas nozzle 58 is so provided as to confront a space (heating space) surrounded with the cylindrical reflector 12. An Ar gas source 66 for storing, for example, an Ar gas as an inert gas or purge gas is connected to the gas nozzle 58 through an opening/closing valve 62 and a gas supply passage 64 having a flow amount control device 60, such as a mass flow controller. An inverse surface deposition preventing mechanism is thereby constructed, which serves as a supplementary means for flowing the purge gas toward the undersurface of the wafer and preventing the formation of any unwanted film from being formed on the side surface and undersurface of the wafer.

At the upper wall of the processing chamber confronting the susceptor 16 a shower head section 68 is provided which serves as both a processing gas supplying means and an etching gas supply means to allow the processing gas, etc, to flow into the processing chamber, that is, into a processing space S between the shower head section 68 and the wafer W. Stated in more detail, the shower head section 68 has a head body 70 formed as a cylindrical box-like configuration with the use of, for example, aluminum and a gas inlet hole 72 provided at the upper wall.

A gas supply mechanism 91 is connected through a gas flow passage 90 to the gas inlet 72 to allow a gas required for processing, that is, in a preferred embodiment, a film forming gas and etching gas to be selectively supplied. This supply mechanism has $WF_6$ gas source 92a, $SiH_4$ gas source 92b, $ClF_3$ gas source 92C, Ar gas source 92d, $N_2$ gas source 92e and $H_2$ gas source 9f connected to six branch passages 90a, 90b, 90c, 90d, 90e and 90f branched from the gas passage 90.

Of these gas sources, the $WF_6$ gas source 92a, $SiH_4$ gas source 92b and $H_2$ gas source 92f are used for film formation, the $ClF_3$ gas source 92C for etching, and the Ar gas source 92A and $N_2$ gas source 92e for use as a carrier gas for both processing purposes. Such kinds of gases are listed by way of one example and it is evident to those skilled in the art that various kinds of film forming gases and etching gases may be used depending upon the kinds of films to be formed. At the branched passages 90a to 90f there are provided flow amount control devices 93a, . . . 93f and opening/closing valve 94a, . . . , 94f and it may be possible to supply desired gases in a desired flow amount to the shower head section 68.

A larger number of gas discharge holes 74 for letting the gas which is supplied into the head body 70 to be discharged into the processing space are provided in the bottom wall of the head body 70 to provide a uniform distribution or a predetermined distribution over a substantially whole area within a given plane. Within the head body 70 there is arranged a diffusion plate 78 provided with a larger number of gas diffusion holes 76 to allow more uniform gas to be supplied to a wafer surface.

With reference to FIGS. 1 to 3C the embodiment of the present invention will be explained below in connection with the film forming processing and etching processing using the above-mentioned apparatus.

Figure 3A:
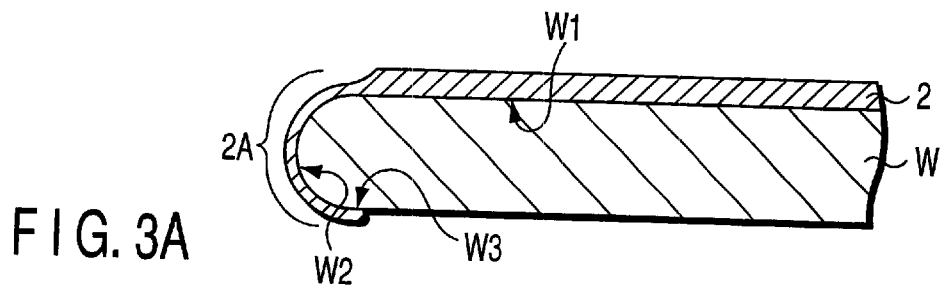
FIGS. 3A to 3C are views for explaining the steps of performing the process of the method according to the present invention.

In FIG. 3A, the reference letter "W" shows a semiconductor wafer as an object to be processed and the semiconductor wafer is formed of, for example, silicon. The semiconductor wafer "W" is of such a type as to have many requisite layers formed thereon or no such layers formed thereon and, here, it is generally referred to simply as a semiconductor wafer W.

Prior to forming a tungsten film, a barrier metal film 2 of a TiN film is deposited as an underlying film on the wafer W. Unlike the processing done on the apparatus shown in FIG. 1, the TiN film formation processing is performed on a processing apparatus using no clamping ring and this is done by sputtering or thermal CVD. Here, a film forming gas use is made of, for example, $TiCl_4$ gas and $NH_3$ gas and the process pressure is as low as about a few Torrs and the process temperature is about 600° C. By this film formation processing, as shown in FIG. 3A, the barrier metal film 2 is deposited on an upper surface W1 of the wafer W and it is also deposited as a not-requisite barrier film 2A on a curved side face (also referred to as a bevel portion) W2 or sometimes on its continuous reverse-surface portion W3.

Figure 3B:
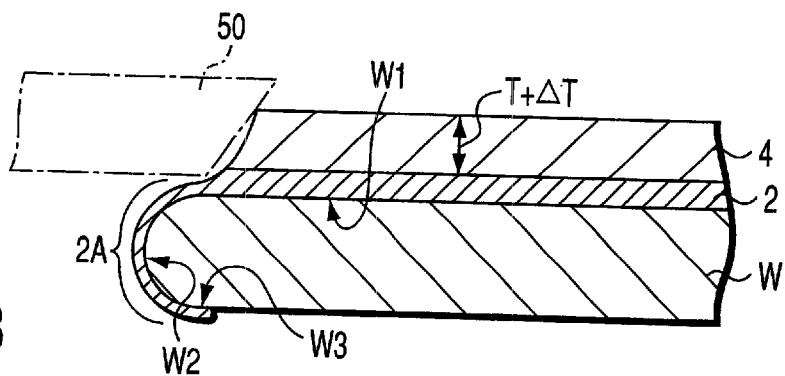

After the barrier metal film 2 is formed, a tungsten film 4 is formed, as shown in FIG. 3B, by the apparatus shown in FIG. 1.

First, the gate valve 56 provided on the sidewall of the processing chamber 10 is opened and the wafer W with a barrier metal film 2 formed thereon is conveyed into the processing chamber 10 by a conveying arm, not shown, and passed to the lifter pin 18 side by pushing up the lifter pins 18. By lowering the push up rod 22, the lifter pin 18s are lowered to allow the wafer W to be placed on the susceptor 16. By further lowering the push up rod 22, the peripheral edge portion of the wafer W is pushed down by the clamping ring 30 to allow it to be fixed in place. At this time, the tapered side face 30A of the clamping ring 30 is set in line contact with the peripheral edge portion of the upper surface of the wafer, so that a high hermetic seal is achieved there.

Then the $WF_6$ gas, $SiH_4$ gas, $N_2$ gas, $H_2$ gas and Ar gas are supplied in predetermined amounts from the gas supply mechanism source 91 into the shower head section 68 where these gases are mixed. The mixed gas is supplied from the gas discharge holes 74 in the bottom wall of the head body 70 into the processing chamber 10 where a substantially uniform distribution is achieved. At the same time, an internal atmosphere is sucked/vented from the vent holes 52 to set the interior of the processing chamber 10 at a predetermined vacuum level, for example, a value of about 80 Torrs. And the heating lamps 38 provided below the susceptor 16 are lighted and rotationally driven, thus radiating heat energy.

The radiated heat energy, after being transmitted through the transmission window 34, radiates the reverse surface of the susceptor 16 to heat it. The susceptor 16, being very thin on the order of a few millimeters, can be quickly heated to a predetermined temperature level. In order to prevent the film forming gas from being deposited around toward the reverse surface side of the wafer W during the film forming processing, an Ar gas from the Ar gas source 66 continues to be supplied from the gas nozzle 58 into a reverse side space S2 during the film formation period. The mixed gas supplied to the processing space S undergoes a given chemical reaction and, as shown in FIG. 3B, a tungsten film 4 is deposited as a main film on that area of the barrier metal film 2 corresponding to the upper surface of the wafer and formed as such.

At the time of film formation processing, since the clamping ring 50 is set in contact with the peripheral edge portion of the wafer W (in more detail, the barrier metal 2), the tungsten film 4 is deposited on only an area corresponding to the upper surface W1 of the wafer W and there is almost no deposition on the areas corresponding to the side face W2 (bevel portion) and reverse surface portion W3. Important here is that, since the tungsten film 4 also is slightly etched away at a later-described etching step, the film thickness of the tungsten film 4 is set to a thickness greater by a thickness corresponding to an etched-away amount $\Delta t$ than a final target value T, that is, to a thickness of $(T+\Delta t)$.

At the completion of forming a tungsten film thus processed, the formed film is subjected to an etching processing.

Figure 2:
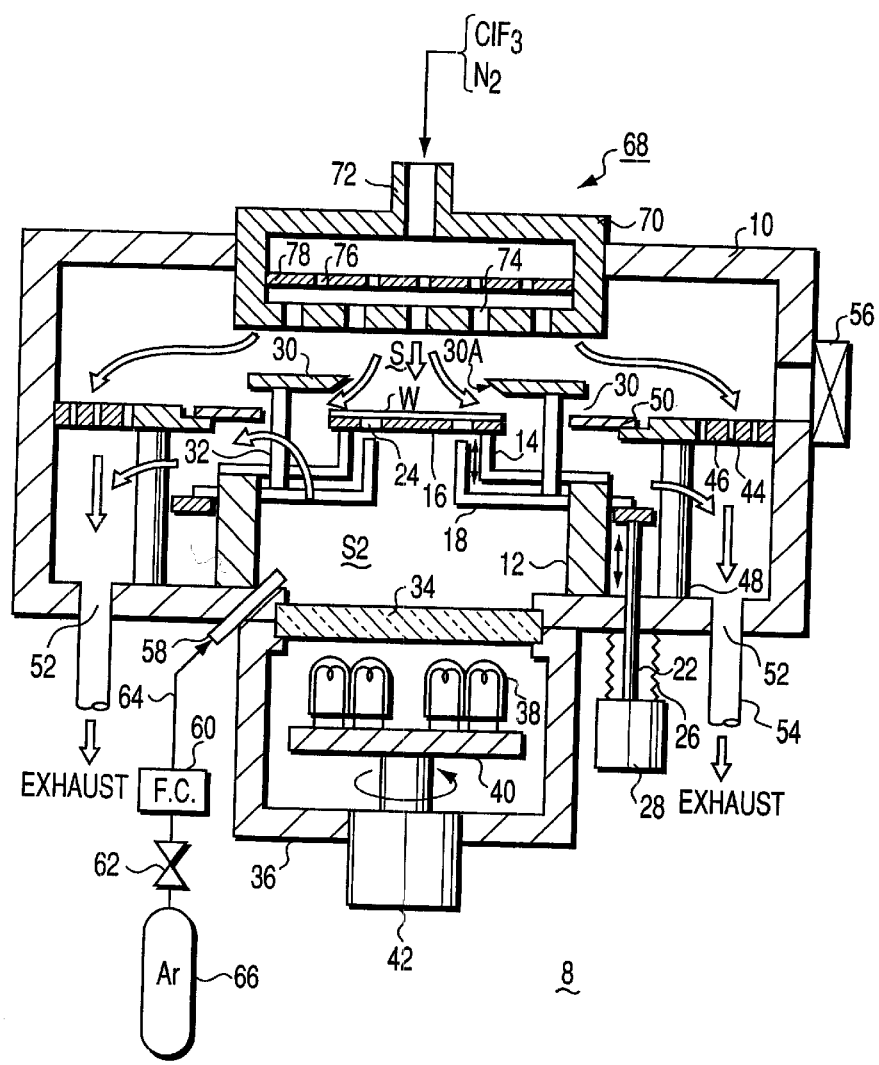
FIG. 2 is a view for explaining side face etching processing with the use of the apparatus shown in FIG. 1.
Figure 3C:
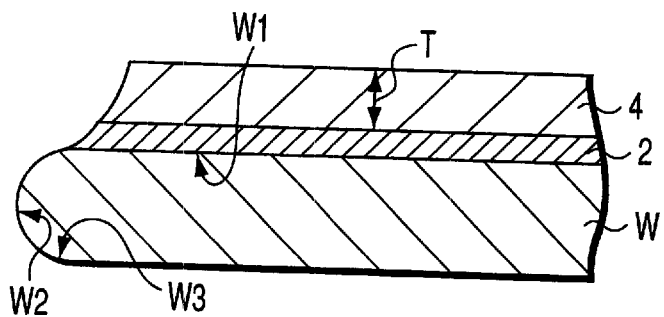

This etching step can be carried out within the processing apparatus 8 where the tungsten film was formed. As shown in FIG. 2, for example, the clamping ring 30 is spaced away from the peripheral edge portion of the wafer W by slightly lifting the clamping ring 30. For this reason, the clamping ring 30 can be stopped to not only to its lowest position as shown in FIG. 1 but also to an uppermost position where the wafer W is passed between the conveying mechanism and the lifter pins 18, and to any intermediate position therebetween. In this state, an etching gas of $ClF_3$, $N_2$ carrier gas, and Ar gas are introduced via the shower head section 68 into the processing chamber 10 during which time the supplying of the Ar gas from the gas nozzle 58 is stopped. The etching gas strikes against the upper surface of the wafer W and flows along its upper surface toward the peripheral edge portion and some of it flows down between the peripheral edge of the wafer W and the clamping ring 30 lifted on a partway as indicated by arrows in FIG. 2. At this time, the tungsten film 4 acts as a mask and an unwanted barrier metal film portion 2A deposited on the side face W2 (bevel portion) and adjacent reverse surface portion W3 is etched away as shown in FIG. 3C. At the same time, the tungsten film 4 is etched by a thickness corresponding to a value $\Delta t$. The etching time in that case is set enough to remove the unwanted barrier metal film portion 2A. At this etching time, the process temperature is set to about 250° C. and the process pressure is set to about 1 Torr. The pressure is fairly lower than some tens Torrs at a tungsten film forming time (the vacuum level is high) and there is no risk that, even if the wafer W is not pressed down, the wafer W may be slid along the susceptor. By doing so, any unwanted barrier metal film 2A formed on the wafer W can be almost completely eliminated.

Although, here, the tungsten film formation processing and etching processing are performed within the same processing apparatus, the present invention is not restricted thereto and the etching processing is performed in a separate processing apparatus.

The characteristics of the tungsten film after the gas etching under a $ClF_3$ gas are also evaluated, the result of which is shown in Table 1.

TABLE 1

| | Tungsten film thickness: 8000 Å (aspect A) | Side face etching under $ClF_3$ (aspect B) | Tungsten film thickness: 7000 Å (aspect C) |
|---|---|---|---|
| Film thickness of tungsten (Å) | 8000 | 7000 | 7000 |
| In-plane uniformity of film (± %) | 3.00 | 3.10 | 2.63 |
| Sheet resistance Rs(mΩ/sq) | 135.16 | 150.05 | 152.74 |
| (average/center area) | 131.60 | 146.20 | 149.91 |
| Reflectivity (%) | 68.90 | 88.10 | 72.16 |
| Stress (dyn/cm²) | $1.16 \times 10^{10}$ | $1.26 \times 10^{10}$ | $1.27 \times 10^{10}$ |

Table 1 shows three aspects: a state (aspect A) when about 8000Å thick tungsten film is formed on a major surface area of TiN film on the wafer surface, a state (aspect B) when the thickness of the tungsten film is etched down to about 7000Å by an etching done in 50 sec under a $ClF_3$ gas and a state (aspect C) when a tungsten film is formed on the wafer to a thickness of about 7000Å (the same thickness as that in the aspect B). In the respective aspects, measurements were made on the in-plane uniformity of the film thickness, sheet resistance, reflectivity and film stress. The etching conditions at this time were the process temperature: 250° C., the process pressure: 1 Torr, the $ClF_3$ flow rate of 250 sccm, and $N_2$ carrier gas flow rate of 500 sccm.

The uniformity of the film thickness falls from 3.00% to 3.10% before and after etching and is 2.63% for the aspect C in which no etching is done. The uniformity of the film thickness for the aspect B is somewhat poor, but it is adequately within an allowable range, thus presenting no problem.

The sheet resistance and film stress are at substantially the same level for the aspects B and C and reveal a better characteristic. The reflectivity is 88.10% for the aspect B and it manifests a better characteristic than for the other aspects A and C. From the above result it is found that, even if the etching processing is performed on the tungsten film (aspect B), it reveals substantially the same characteristic as that for the aspect C in which a tungsten film is grown to the same thickness as that for the aspect B and not subjected to etching and, even if etching is performed on the tungsten film, this film characteristic is not deteriorated and shows a better characteristic.

Figure 4:
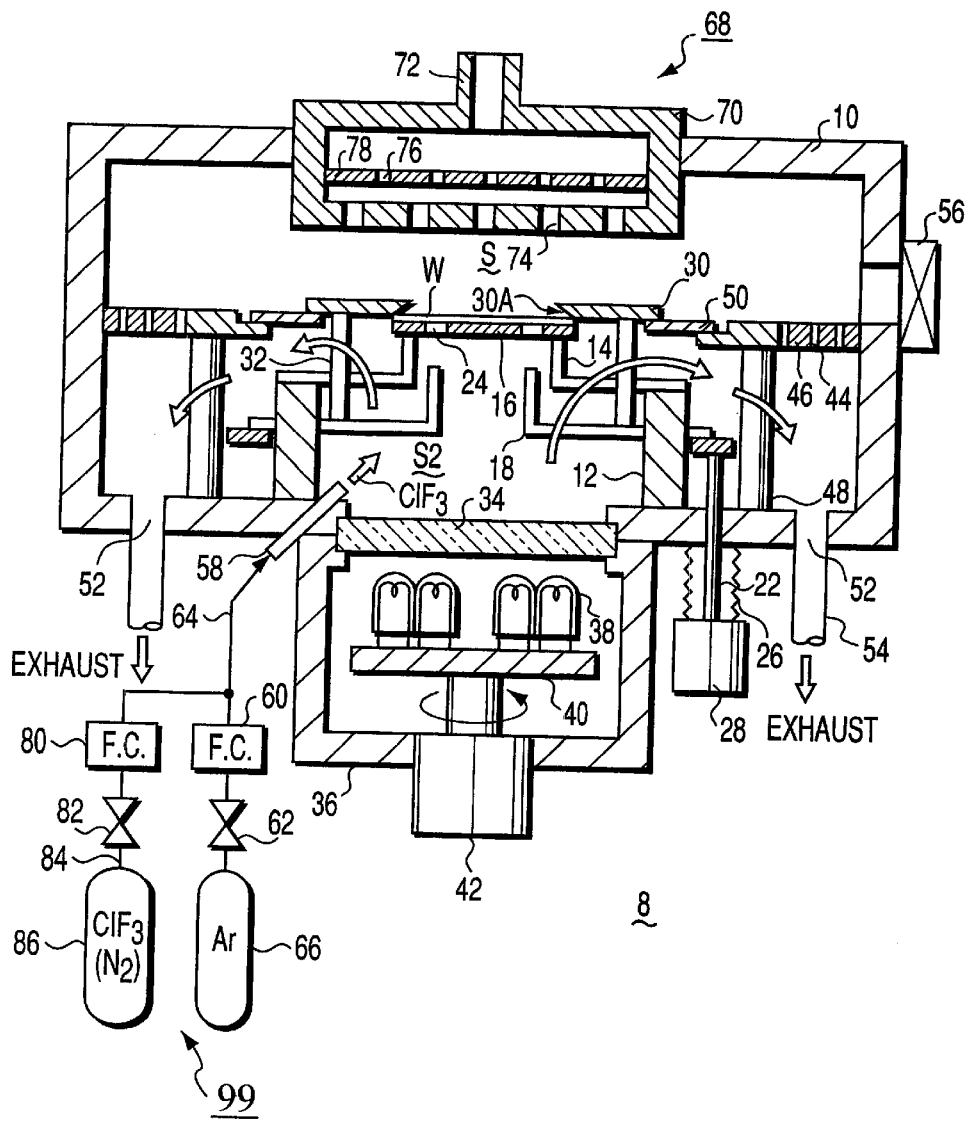
FIG. 4 is a diagrammatic view showing a modification of the processing apparatus of the present invention.

Although, in the above-mentioned embodiment, not only a not-requisite barrier metal film portion but also the tungsten film portion is etched, at the same time, in the etching step shown in FIG. 3C, it may be possible that, by designing the processing apparatus properly, only the not-requisite barrier metal film portion is etched without etching the tungsten film. FIG. 4 shows one example of such a processing apparatus. Here, in the apparatus as shown in FIG. 4, an etching gas supply mechanism 99 is connected to a gas nozzle 58. That is, a branch gas supply passage 84 is connected to the gas supply passage 64 through an opening/closing valve 82 and flow amount control device 80 and a $ClF_3$ source (including an $N_2$ gas source an Ar gas source) 86 storing a $ClF_3$ gas, $N_2$ gas and Ar gas as an etching gas is connected to an end of the branch gas supply section 84. Thus, at a time of performing side-face etching processing, the $ClF_3$ gas is introduced from the gas nozzle 58 instead of being supplied from the shower head 68. As the gas nozzle use may be made of a single gas nozzle, but it is preferable that, in order to allow the etching gas to uniformly flow over a whole periphery of the wafer, a plurality of gas nozzles be arranged in a spaced-apart relation at predetermined intervals in a circumferential direction. These gas nozzles may be connected to a common gas source in a practical application.

Figure 5A:
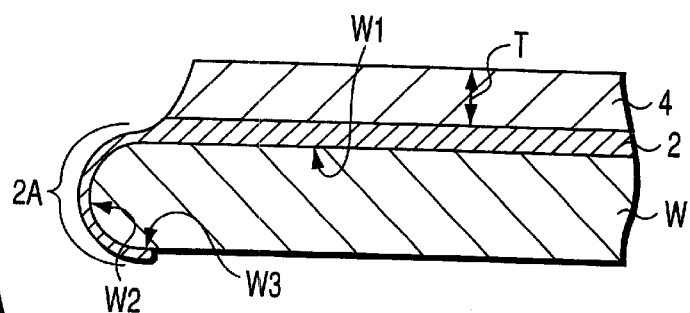
FIGS. 5A and 5B are views showing the main steps of a modified process of a method according to the present invention.

In the case of using the processing apparatus shown in FIG. 4, a tungsten film 4 is so formed that, as shown in FIG. 5A, it is deposited to a thickness just corresponding to a target value T, not excessively deposited by the thickness Δt as explained in FIG. 3B. At a time of etching processing, as shown in FIG. 4, the clamping ring 30 is lowered, to allow its contacting face 30A to be set in contact with the peripheral edge portion of the wafer W. In place of flowing a $ClF_3$ gas from the shower head section 68 a $ClF_3$ gas, $N_2$ gas and Ar gas is flowed as an etching gas into a reverse-surface space S2 from the gas nozzle (nozzles) 58. These gases, after being flowed along a side face W2 of the wafer W, are discharged from vent side holes 52 and almost never flowed into a processing space S side which is defined on the upper surface side of the wafer W.

Figure 5B:
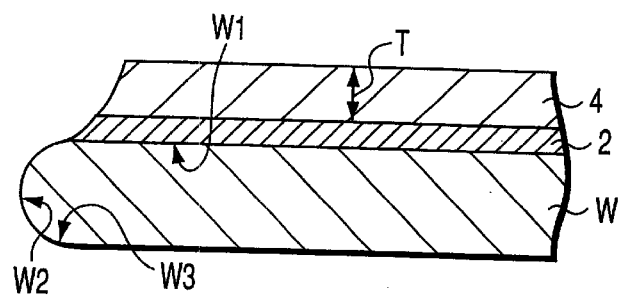
Figure 6A:
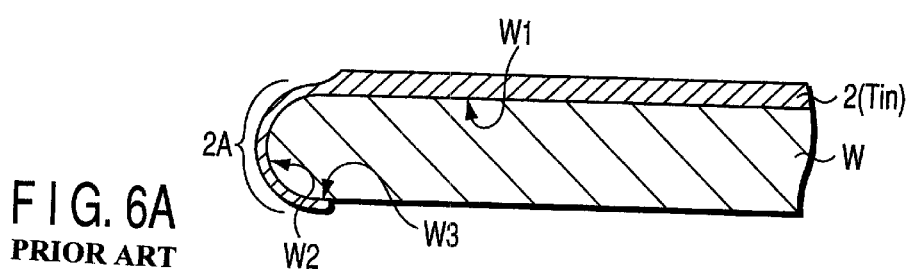
FIGS. 6A and 6B are views showing some steps of a process of a conventional method applied to a semiconductor device.
Figure 6B:
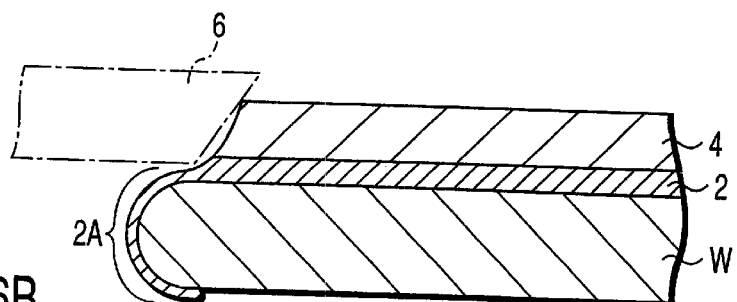

As shown in FIG. 5B, only an unwanted barrier metal film portion 2A deposited on a side face W2 or sometimes an adjacent reverse surface portion W3 of the wafer W can be etched away without etching any tungsten film 4.

According to this embodiment, it is only necessary that the tungsten film be formed to a thickness smaller by a value Δt than the case explained in connection with FIGS. 3A to 3C. In this case it is possible to reduce the processing time by that extent.

Although, in the above-explained embodiment, an explanation is made about the case of using the $ClF_3$ gas as a main etching gas, the present invention is not restricted thereto and it may be possible to use, as an etching gas, a gas such as a CF-based gas or HF based gas. It is preferable to use an etching gas, in particular, higher in etching rate for an underlying film (barrier metal film) than for a main film (tungsten film). Although a plasmaless thermal etching has been explained as being performed at a time of etching processing, it may be possible to perform plasma etching processing with the use of a plasma.

Although, here, the barrier metal film comprised of a TiN film has been explained as being used as the underlying film and the tungsten film as being used as the main film, the present invention is not restricted thereto and the present invention can of course be applied to other proper kinds of films. It is possible to used Al (aluminum), W (tungsten), WSi (tungsten silicide) or TiSi (titanium silicide) as an upper film material and Ti (titanium) or TiN (titanium nitride) as an underlying material.

Further, the to-be-processed object is not restricted to the semiconductor wafer and is applicable also to an LCD substrate, glass substrate or other objects.

Figure 7:
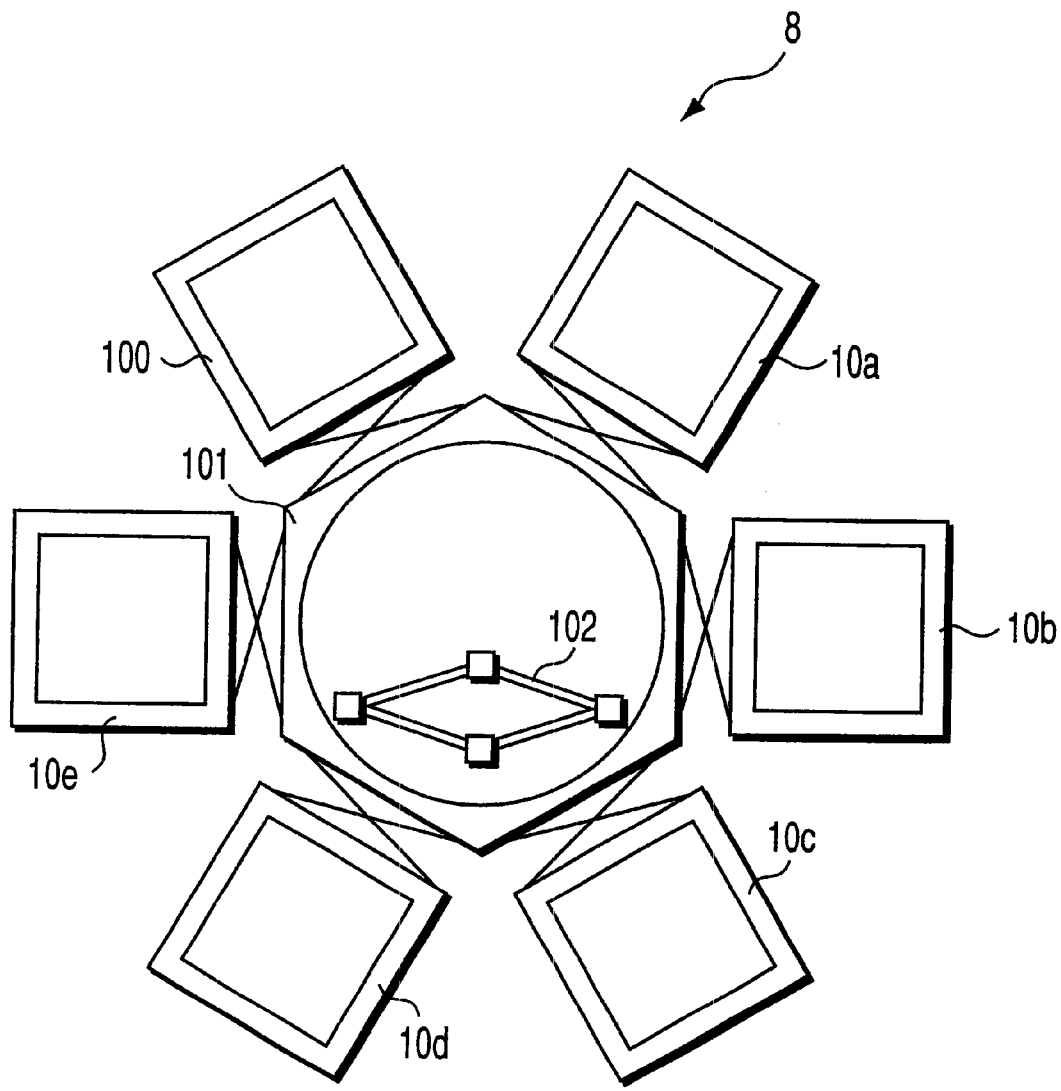
FIG. 7 is a view schematically showing an apparatus according to the other embodiment.

In the aforementioned embodiments, although, the formation of the main film and etching of the undesired portion of the underlying film or barrier metal film are made in the same processing chamber, these treatments may be made, using different processing chambers. That is, a processing apparatus 8 of, for example, a multi-chamber type as shown in FIG. 7 may be used, which includes a plurality of processing chambers (five processing chambers 10a–10e in this preferred embodiment). In the apparatus, the processing chambers are respectively connected to a transfer chamber 101 through gate valves. A transfer mechanism 102 provided in the transfer chamber 101 transfers an object to be processed or a processed object between the processing chambers. Reference numeral 100 shows a loading or unloading chamber for the object.

In this apparatus, the first chamber 10a is a device or chamber for a CVD or sputtering to form the barrier metal film, and the second and third chambers 10b, 10c are respectively the same devices or chambers as the film forming /etching devices shown in FIG. 1. Alternately, one chamber may be a chamber for only a film formation (having no etching means) and the other chamber may be a chamber for only an etching (having no film forming means).

Using of such an apparatus having a multi-chamber, after an underlying film is formed on the object in the first processing chamber 10a, the object is transferred into the second processing chamber 10b in which a main film is formed on the main area of the underlying film. Thereafter, the object is conveyed into the third processing chamber 10c by the transfer mechanism, in which the underlying film is partially etched using the main film as a mask.

As set out above,. according to the present invention, it is possible to obtain the following excellent advantage.

The unwanted underlying film deposited on the side face (bevel portion) of the to-be-processed object and any unwanted underlying film, if deposited on, a reverse-surface portion continuous to the bevel portion can be effectively etched away.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A method for forming a film, comprising:
   forming an underlying film on a major surface of a to-be-processed object and on a side face;
   forming a main film on that portion of the underlying film portion corresponding to the major surface of the object; and
   etching the underlying film portion while leaving a given underlying film portion beneath the main film with the use of the main film as a mask.

2. A method according to claim 1, wherein the main film forming comprises forming the main film to a thickness larger than a target thickness and the etching comprises etching an upper surface of the main film to the target thickness.

3. A method according to claim 1, wherein the underlying film forming comprises forming the underlying film by sputtering or a chemical vapor deposition method.

4. A method according to claim 1, wherein the main-film forming is to form a main film by setting a clamping ring in contact with a peripheral edge portion of the major surface of the object to fix the object on a susceptor and flowing a film forming gas onto the major surface of the object and the etching is performed by placing the object on the susceptor, moving the clamping ring away from the peripheral edge portion of the object and effecting etching by flowing an etching gas toward the major surface of the object.

5. A method according to claim 1, wherein, during the formation of the main film, a purge gas is flowed from a reverse-surface side of the object and, during the etching step, the purge gas is stopped from being flowed from the reverse surface side of the object.

6. A method according to claim 1, wherein said step of forming an underlying film comprises forming an underlying film on a reverse-surface of the object adjacent the side face.

7. A method for forming a film, comprising:
   placing a to-be-processed object on a susceptor within a processing chamber with a major surface set on an upper side, the object having an underlying film formed on the major surface and on a side face;
   fixing the object to the susceptor with a clamping ring set in contact with that portion of the underlying film corresponding to a peripheral edge portion of the major surface of the object;
   supplying a processing gas from above the susceptor into a processing chamber, thereby forming a main film on that portion of the underlying film surrounded with the clamping ring; and
   flowing an etching gas from a reverse-surface side of the object and etching away a portion of the underlying film, which is exposed, not covered with the main film.

8. A method according to claim 7, wherein, during the main film forming, a purge gas is flowed from a reverse surface side of the object and, during the etching, the purge gas is stopped from being flowed from the reverse surface side of the object.

9. A method according to claim 7, wherein the etching is done with the object fixed to the susceptor by the clamping ring.

10. A method according to claim 7, wherein the object has an underlying film formed on a reverse-surface portion adjacent the side face.

11. A method for forming a film, comprising:
   placing a to-be-processed object on a susceptor within a processing chamber with a major surface of the object set on an upper side, the object having an underlying film formed on the major surface and adjacent side face;
   fixing the object to the susceptor with a clamping ring set in contact with an underlying film portion corresponding to a peripheral edge portion of the major surface of the object;
   supplying a processing gas into the processing chamber from a shower head located above the susceptor, thereby forming a main film on that portion of the underlying film surrounded with the clamping ring;
   moving the clamping ring upwardly and away from the object; and
   applying an etching gas between the clamping ring and the object and etching away any portion of the underlying film, which is exposed, not covered with the main film.

12. A processing apparatus comprising:

a processing chamber;

a support mechanism provided within the processing chamber to-support a to-be-processed object having an underlying film formed on a major surface and adjacent side face;

said support mechanism comprising a susceptor on which the object is placed, a clamping ring movable among a first position in which the object is fixed to the susceptor, a second position in which the clamping ring is apart from the object, and a third position in which the object is horizontally moved, the second position being positioned between the first and third positions;

a gas supply member provided at the processing chamber in a spaced apart relation to the support mechanism, to allow an incoming gas to be supplied into the processing chamber; and a gas carrying mechanism for selectively sending a film forming gas and etching gas to the gas supply member, wherein the main film is formed on a portion of the underlying film formed on the object when the clamping ring is positioned in the first position, by using the film forming gas, and a portion of the underlying film, which is exposed, not covered with the main film, is etched away by the etching gas when the clamping ring is positioned in the second position.

13. An apparatus according to claim 12, wherein the support mechanism comprises a drive mechanism for driving the clamping ring in an up/down direction among the first, second and third positions.

14. Apparatus according to claim 13, wherein the drive mechanism maintains the clamping ring in an intermediate position between the upper position and the lower position when the etching is done.

15. A processing apparatus comprising:

a processing chamber;

a support mechanism provided within the processing chamber to support a to-be-processed object having an underlying film formed on a major surface and adjacent side face;

a film forming mechanism for supplying a film forming gas onto the major surface of the object supported by the support mechanism and forming a main film on a portion of the underlying film; and a purge gas/etching gas supply mechanism for selectively supplying a purge gas and etching gas into the processing chamber, the purge gas being flowed toward a reverse-surface and side-face side of the object at a time of forming a film to prevent the film forming gas from being flowed around toward the reverse-surface and the etching gas being flowed toward the reverse-surface and side-face side to etch away a portion of the underlying film, which is exposed, not covered with the main film.

16. An apparatus according to claim 15, wherein the support mechanism has a susceptor on which the object is placed and an up/down movable clamping ring which, when the film is formed or etching is done, is set into contact with a portion of the underlying film corresponding to the peripheral edge portion of the major surface of the object placed on the susceptor to fix the object to the susceptor.

17. An apparatus according to claim 15, wherein the purge gas/etching gas supply mechanism has at least one gas nozzle for selectively discharging the purge gas and etching gas.

18. A processing apparatus comprising:

first and second processing chambers;

supporting mechanisms respectively provided within the processing chambers to support an object;

each of said support mechanisms comprising a susceptor on which the object is placed, a clamping ring movable among a first position in which the object is fixed to the susceptor, a second position in which the clamping ring is apart from the object, and a third position in which the object is horizontally moved, the second position being positioned between the first and third positions;

gas supply mechanisms respectively provided in the processing chambers in a spaced apart relation against the supporting mechanisms, each gas supply mechanism supplying a gas fed thereto into the corresponding processing chamber;

a first gas feeding mechanism for feeding a film forming gas into the gas supply mechanism of the first processing chamber;

a second gas feeding mechanism for feeding an etching gas into the gas supply mechanism of the second processing chamber; and a transfer mechanism for transferring the object to the second processing chamber from the first processing chamber, wherein a main film is formed on the portion of an underlying film formed on the object when the clamping ring is positioned in the first position within the first processing chamber, by the film forming gas, and the object having the main film formed thereon is transferred into the second processing chamber by the transfer mechanism and placed on the susceptor in the second chamber, and then that portion of the underlying film which is exposed, not covered with the main film, is etched away by the etching gas when the clamping ring is positioned in the second position within the second processing chamber.

\* \* \* \* \*